(12) United States Patent
Tanaka et al.

(10) Patent No.: US 10,411,307 B2
(45) Date of Patent: Sep. 10, 2019

(54) SECONDARY BATTERY, EVALUATION METHOD AND PRODUCTION METHOD THEREFOR, AND CHARGE-DISCHARGE CONTROL DEVICE

(71) Applicant: SONY CORPORATION, Tokyo (JP)

(72) Inventors: Masatomo Tanaka, Kanagawa (JP); Yoshifumi Shimizu, Kanagawa (JP); Yuto Horiuchi, Kanagawa (JP); Shigetaka Tomiya, Kanagawa (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/571,227

(22) PCT Filed: May 9, 2016

(86) PCT No.: PCT/JP2016/063730
§ 371 (c)(1),
(2) Date: Nov. 1, 2017

(87) PCT Pub. No.: WO2017/026149
PCT Pub. Date: Feb. 16, 2017

(65) Prior Publication Data
US 2018/0269540 A1    Sep. 20, 2018

(30) Foreign Application Priority Data
Aug. 10, 2015 (JP) .................. 2015-158314

(51) Int. Cl.
*H02J 7/00* (2006.01)
*H01M 10/44* (2006.01)
(Continued)

(52) U.S. Cl.
CPC ........ *H01M 10/44* (2013.01); *G01R 31/3842* (2019.01); *H01M 10/0525* (2013.01);
(Continued)

(58) Field of Classification Search
USPC .......................................... 320/134
See application file for complete search history.

(56) References Cited

U.S. PATENT DOCUMENTS

2010/0072951 A1* 3/2010 Nakashima ............. H01M 2/16
320/145
2011/0084702 A1* 4/2011 Mori ................... H01M 10/441
324/430
(Continued)

FOREIGN PATENT DOCUMENTS

CN      101542821 A     9/2009
CN      101569052 A    10/2009
(Continued)

OTHER PUBLICATIONS

International Search Report and Written Opinion of PCT Application No. PCT/JP2016/063730, dated Aug. 2, 2016, 08 pages of ISRWO.
(Continued)

*Primary Examiner* — Mohammed Alam
(74) *Attorney, Agent, or Firm* — Chip Law Group

(57) ABSTRACT

Provided is a technology that can improve a cycle property without lowering a volume energy density. The present technology provides a method for evaluating a secondary battery, including conducting at least: a determination step of determining a degree of diffusion defect of an ion that performs electric conduction; an evaluation step of evaluating a state of the secondary battery on the basis the result of the determination in the determination step; and a control step of controlling states of current application and voltage application on the secondary battery during charging or during discharging of the secondary battery on the basis of the result of the evaluation in the evaluation step.

8 Claims, 5 Drawing Sheets

(51) Int. Cl.
  *H01M 10/48* (2006.01)
  *H01M 10/0525* (2010.01)
  *H01M 10/42* (2006.01)
  *G01R 31/3842* (2019.01)
  *G01R 31/385* (2019.01)

(52) U.S. Cl.
  CPC ......... *H01M 10/425* (2013.01); *H01M 10/48* (2013.01); *H02J 7/007* (2013.01); *H02J 7/0068* (2013.01); *G01R 31/385* (2019.01); *H01M 10/42* (2013.01); *H01M 2010/4271* (2013.01)

(56) References Cited

U.S. PATENT DOCUMENTS

| | | | | |
|---|---|---|---|---|
| 2013/0076363 | A1* | 3/2013 | Takahashi | H01M 10/48 324/427 |
| 2018/0269540 | A1* | 9/2018 | Tanaka | G01R 31/3842 |

FOREIGN PATENT DOCUMENTS

| | | |
|---|---|---|
| CN | 102043132 A | 5/2011 |
| CN | 104395771 A | 3/2015 |
| EP | 1983602 A1 | 10/2008 |
| EP | 2837944 A1 | 2/2015 |
| JP | 11-233155 A | 8/1999 |
| JP | 2003-047159 A | 2/2003 |
| JP | 2008-181866 A | 8/2008 |
| JP | 2011-103291 A | 5/2011 |
| JP | 2015-104139 A | 6/2015 |
| KR | 10-2009-0094006 A | 9/2009 |
| WO | 2008/078552 A1 | 7/2008 |

OTHER PUBLICATIONS

Extended European Search Report of EP Patent Application No. 16834846.4, dated Aug. 30, 2018, 08 pages.

Office Action for CN Patent Application No. 201680025591.5, dated Feb. 3, 2019, 11 pages of Office Action and 14 pages of English Translation.

* cited by examiner

SECONDARY BATTERY, EVALUATION METHOD AND PRODUCTION METHOD THEREFOR, AND CHARGE-DISCHARGE CONTROL DEVICE

CROSS REFERENCE TO RELATED APPLICATIONS

This application is a U.S. National Phase of International Patent Application No. PCT/JP2016/063730 filed on May 9, 2016, which claims priority benefit of Japanese Patent Application No. JP 2015-158314 filed in the Japan Patent Office on Aug. 10, 2015. Each of the above-referenced applications is hereby incorporated herein by reference in its entirety.

TECHNICAL FIELD

The present disclosure relates to a secondary battery, an evaluation method and a production method therefor, and a charge-discharge control device.

BACKGROUND ART

Currently, increasing of capacity and improvement of performances are demanded for secondary batteries, specifically lithium ion secondary batteries. Therefore, techniques such as film thickening and increasing of density of electrodes, and introduction of materials having higher Li-storage ability than those of conventional materials, and the like have been developed. However, such film thickening and increasing of density of electrodes, and such batteries using novel materials have a problem of occurrence of a rapid deterioration phenomenon, in which a deterioration reaction gradually progresses inside a battery in accordance with use for a long term, and a side reaction that is different from a general charging and discharging reaction dominantly occurs at a certain timing, and thus an electric capacity that can be taken out is significantly decreased (a rapid deterioration phenomenon in a secondary battery, which is determined as results of both an analysis of voltage responses during application of a constant current and during a rest and an analysis of a current response during application of a constant voltage).

One of the causes thereof is a phenomenon called as reversible Li loss, in which Li released from a positive electrode during charging is not withdrawn into a negative electrode active substance but precipitates as a Li-containing compound or metallic Li, whereby the amount of Li that can be used in a general charging and discharging reaction is decreased (a phenomenon in which the amount of Li that provides and receives electrons by transferring between a positive electrode and a negative electrode decreases). If this reversible Li loss occurs at an accelerated rate, then the charge-discharge efficiency significantly decreases. Therefore, attempts to suppress cycle deterioration by controlling charging and discharging on the basis of a result of presumption of battery states during charging and discharging are made.

One of the above-mentioned attempts is present as a technique of calculating an internal resistance of a secondary battery, and controlling the secondary battery so as to avoid a predetermined deterioration promotion area on the basis of the result of the calculation thereof (see Patent Document 1). Another one of the above-mentioned attempts is present as a technique of defining a negative electrode voltage on a lithium standard electrode to be in a range not greater than 0.6 V, for the purpose of suppressing occurrence of a polarization phenomenon of a negative electrode active substance in which Li is stored associated with discharging (see Patent Document 2).

CITATION LIST

Patent Document

Patent Document 1: Japanese Patent Application Laid-Open No. 2003-047159
Patent Document 2: Japanese Patent Application Laid-Open No. 11-233155

SUMMARY OF THE INVENTION

Problems to be Solved by the Invention

In the technique disclosed in Patent Document 1, when an internal resistance at a predetermined value or more is detected, it is possible to restrict the battery so as not to consume a battery capacity. However, there are plural causes for increasing an internal resistance, and thus there is a problem that increase in internal resistance caused by any reason other than rapid deterioration is also sensed, and thus an available energy density is consequently lowered.

Furthermore, in the technique disclosed in Patent Document 2, the negative electrode voltage against the lithium standard electrode is defined to be in a range not greater than 0.6 V, but there is a problem that the volume energy density is decreased due to such definition.

Regarding the problem of decrease in cycle property, which is one of the important properties in achieving increasing of the capacity and improvement of the performances of a secondary battery, it cannot still be the that a sufficient countermeasure is made in the techniques disclosed in the above-mentioned Patent Documents 1 and 2 from the viewpoints of control of charging and discharging.

The present technology has been made in view of such problem, and the object of the technique is to provide a secondary battery that can improve a cycle property without lowering a volume energy density, an evaluation method and a production method therefor, and a charge-discharge control device.

Solutions to Problems

The present inventors did intensive studies so as to solve the above-mentioned object, and consequently focused on a degree of diffusion defect of an ion that performs electric conduction, and completed the present disclosure.

That is, the present disclosure first provides a method for evaluating a secondary battery, including conducting at least:

a determination step of determining a degree of diffusion defect of an ion that performs electric conduction;

an evaluation step of evaluating a state of the secondary battery on the basis of the result of the determination in the determination step; and a control step of controlling states of current application and voltage application on the secondary battery during charging or during discharging of the secondary battery on the basis of the result of the evaluation in the evaluation step.

The present disclosure next provides a method for producing a secondary battery, including at least:

a determination process of determining a degree of diffusion defect of an ion that performs electric conduction;

an evaluation process of evaluating a state of the secondary battery on the basis of the result of the determination in the determination process; and a control process of controlling, on the basis of the result of the evaluation in the evaluation process, states of current application and voltage application on the secondary battery during charging or during discharging of the secondary battery.

The present disclosure next provides a charge-discharge control device, including:

a determination unit configured to determine a degree of diffusion defect of an ion that performs electric conduction;

a state evaluation unit configured to evaluate a state of a secondary battery on the basis of the determination result from the determination unit; and a charge-discharge control unit configured to control the states of application of a current and application of a voltage to the secondary battery during charging or during discharging of the secondary battery on the basis of the evaluation result of the state evaluation unit.

The present disclosure next provides a secondary battery, including:

a determination unit configured to determine a degree of diffusion defect of an ion that performs electric conduction;

a state evaluation unit configured to evaluate a state of the secondary battery on the basis of the determination result from the determination unit; and a charge-discharge control unit configured to control the states of application of a current and application of a voltage to the secondary battery during charging or during discharging of the secondary battery on the basis of the evaluation result of the state evaluation unit.

Effects of the Invention

According to the present disclosure, a cycle property can be improved without lowering a volume energy density.

Note that the effect described herein is not necessarily limited, and may be either of the effects described in the present disclosure.

MODE FOR CARRYING OUT THE INVENTION

Figure 1:
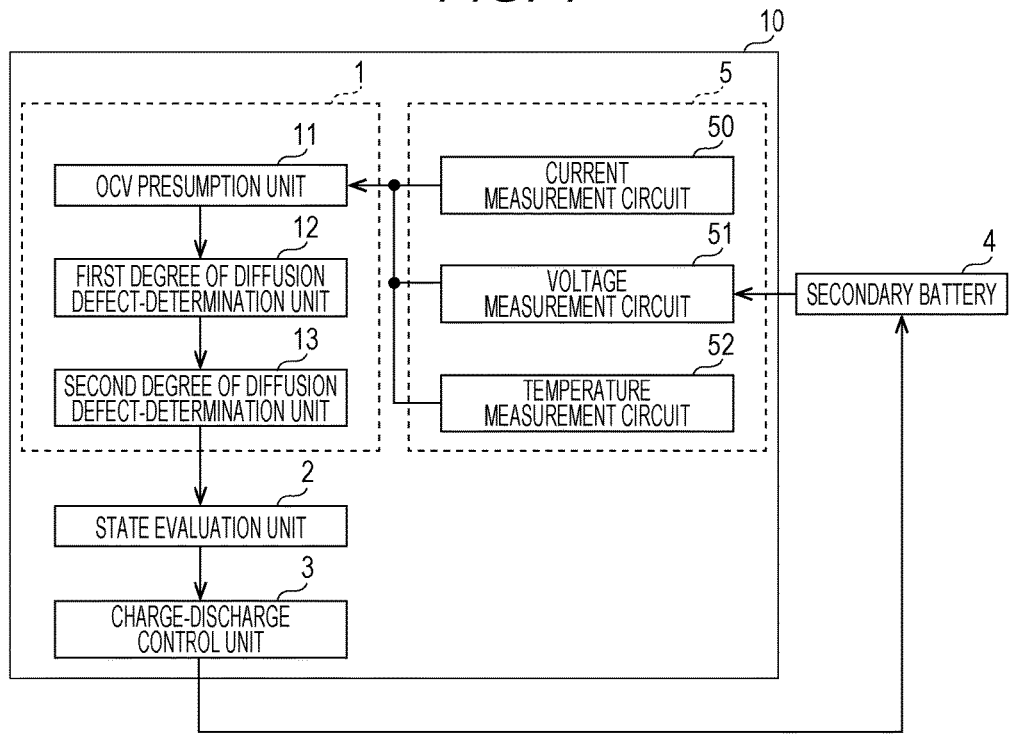
FIG. 1 is a schematic conception drawing that schematically shows a first exemplary embodiment of the charge-discharge control device 10 according to the present disclosure.

Hereinafter the preferable embodiments for carrying out the present disclosure will be explained with referring to the drawings. The exemplary embodiments explained below indicate examples of the representative exemplary embodiments of the present disclosure, and the scope of the present disclosure is not interpreted to be narrow due to these exemplary embodiments. Note that the explanations are made by the following order.
1. First Exemplary Embodiment
(Explanations relating to an evaluation method and a production method for a secondary battery, and a charge-discharge control device)
2. Second exemplary embodiment
(An explanation relating to a secondary battery)
3. Examples
(Explanations relating to an evaluation method and a production method for a secondary battery of the first exemplary embodiment of the present disclosure, and a charge-discharge control device)

First Exemplary Embodiment

Figure 2:
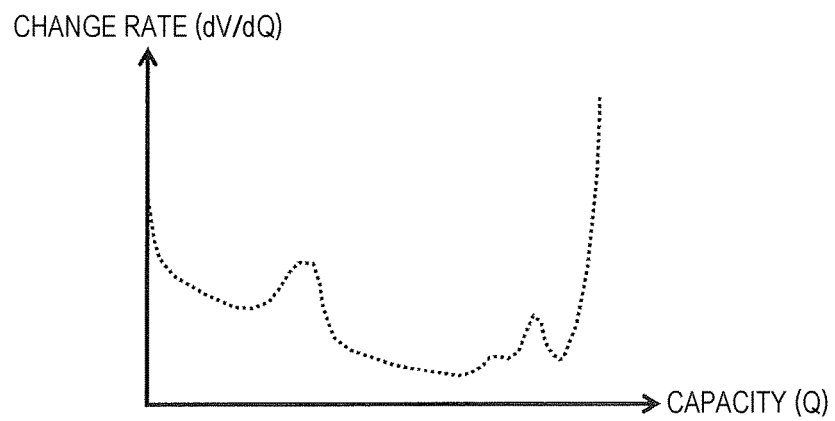
FIG. 2 is an example of a wave form in which a change rate (dV/dQ) is put on the longitudinal axis and a capacity (Q) is put on the abscissa axis.
Figure 3:
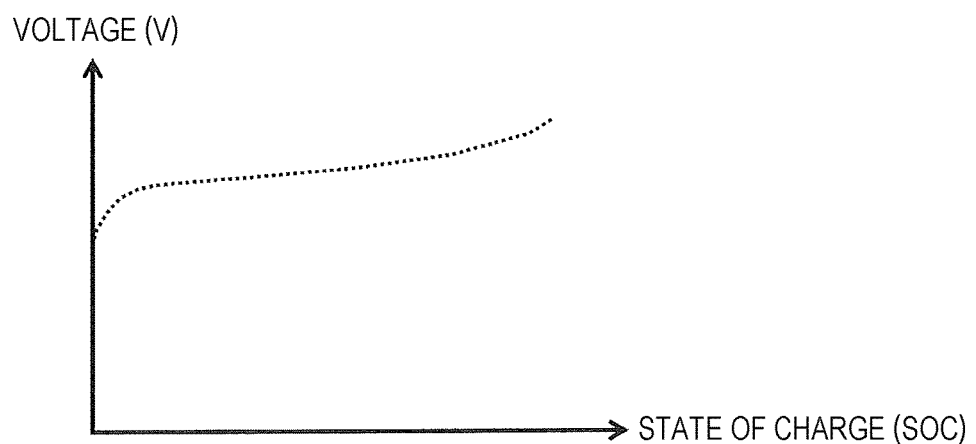
FIG. 3 is an example of a SOC-OCV curve of a positive electrode.
Figure 4:
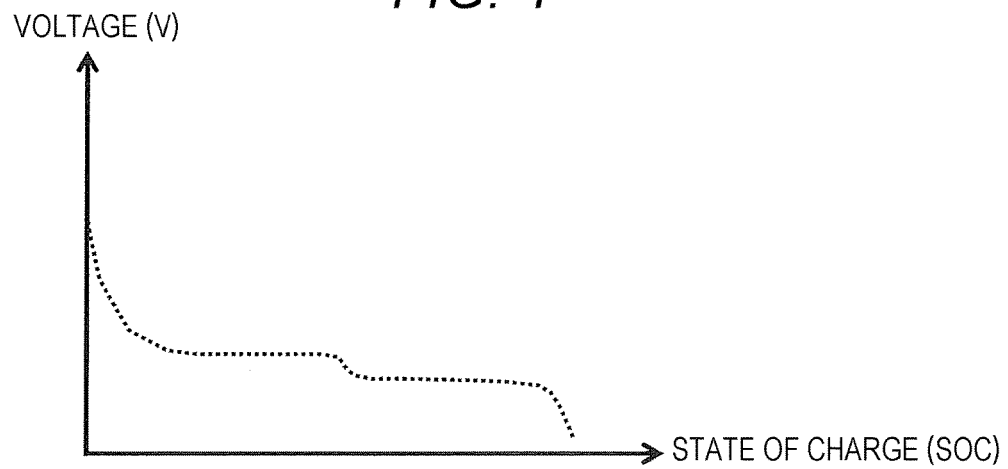
FIG. 4 is an example of a SOC-OCV curve of a negative electrode.

Firstly, an evaluation method and a production method for a secondary battery according to the first exemplary embodiment of the present disclosure, and a charge-discharge control device will be explained.
[Overall Constitution]
FIG. 1 is a schematic conception drawing that schematically shows a first exemplary embodiment of a charge-discharge control device 10 according to the present disclosure. The charge-discharge control device 10 according to the present disclosure generally includes a determination unit 1, a state evaluation unit 2, and a charge-discharge control unit 3. The symbol 4 in FIG. 1 indicates a secondary battery. Furthermore, the charge-discharge control device 10 can further include a detection unit 5 and the like as necessary. The respective units will be explained in detail.
[Detection Unit 5]
The detection unit 5 includes a current measurement circuit 50, a voltage measurement circuit 51 and a temperature measurement circuit 52. Each of the circuits can be constituted by using a well-known circuit. The current measurement circuit 50 is configured to measure a current that flows to a secondary battery 4 and output the result of the measurement at a determination unit 1. The voltage measurement circuit 51 is configured to measure a voltage of the secondary battery 4 and output the result of the measurement at the determination unit 1. The temperature measurement circuit 52 is configured to measure a surface temperature of the secondary battery 4 and output the result of the measurement at the determination unit 1.
[Determination Unit 1]
The determination unit 1 is configured to determine a degree of diffusion defect of an ion that performs electric conduction on the basis of a result of an analysis of voltage responses during application of a constant current and during a rest and a result of an analysis of a current response during application of a constant voltage. The degree of diffusion defect refers to a degree of a defect that is caused by the changes in the parameters involved in the diffusion of an ion (for example, a diffusion coefficient and a diffusion distance). The determination unit 1 includes an open circuit voltage (OCV) presumption unit 11, a first degree of diffusion defect-determination unit 12, and a second degree of diffusion defect-determination unit 13.
(OCV Presumption Unit 11)
The OCV presumption unit 11 is configured to presume an OCV on the basis of a position of an inflection point on a wave form in which a change rate (dV/dQ) of a voltage (V)

with respect to a capacity (Q) is put on the longitudinal axis and the capacity (Q) is put on the abscissa axis. Note that FIG. 2 is an example of a wave form in which a change rate (dV/dQ) is put on the longitudinal axis and a capacity (Q) is put on the abscissa axis. Note that the means for the presumption of an OCV is not specifically questioned. For example, an OCV can be presumed by the OCV presumption unit 11 by using standard data of an SOC-OCV curve showing a relationship with a state of charge (SOC). Note that FIG. 3 is an example of a SOC-OCV curve of a positive electrode. Furthermore, FIG. 4 is an example of a SOC-OCV curve of a negative electrode.

(First Degree of Diffusion Defect-Determination Unit 12)

The first degree of diffusion defect-determination unit 12 is configured to calculate a difference from the OCV with respect to a voltage response during constant current charging, and determines whether or not the calculated difference is greater than a predetermined threshold value. Furthermore, the first degree of diffusion defect-determination unit 12 determines that the degree of diffusion defect is a first degree of diffusion defect in a case where the difference is greater than the threshold value. In addition, the first degree of diffusion defect-determination unit 12 can keep data of a threshold value of a voltage error at a certain state of charge (SOC) in advance as a database, and can conduct the determination during constant current charging on the basis of whether or not the difference is greater than that threshold value. For example, an initial value that has been stored in advance in a database is used as the threshold value, and the determination is conducted by comparing the initial value and the difference. The following Table 1 shows an example of the database (an assembly of the data of the threshold values of the voltage errors).

TABLE 1

| SOC | mV |
|---|---|
| 20 | 6.5 |
| 25 | 6.8 |
| 30 | 8.6 |
| 35 | 11.6 |
| 40 | 15.6 |
| 45 | 20.7 |
| 50 | 26.5 |
| 55 | 32.6 |
| 60 | 37.1 |

In addition, the means is not questioned also for the determination of the first degree of diffusion defect. For example, the first degree of diffusion defect-determination unit 12 may simply see the significance of a voltage difference, or may conduct a time constant analysis in the voltage difference to thereby separate the voltage difference into a component that is synchronized with a current and a component that responds to a current in a delayed fashion. Furthermore, for example, the first degree of diffusion defect-determination unit 12 may use an error average of a difference in which a component that is synchronized with a current is removed from a voltage difference, or the like. As a result of such voltage response analysis during application of a current, in a case where the voltage is greater than a threshold value, the first degree of diffusion defect-determination unit 12 determines that the degree of diffusion defect is the first degree of diffusion defect.

Furthermore, other means for determining as the first degree of diffusion defect may be a method including measuring a voltage response for every time constant during charging and extracting a diffusion component of an internal resistance by using a means such as a potentiostatic intermittent titration technique (PITT) process, a galvanostatic intermittent titration technique (GITT) process, an electrochemical impedance spectroscopy (EIS) process, a current pulse relaxation process or the like, or may be a method including extracting diffusion component from an analysis of a response obtained from a result of single application or multiple applications of a current or voltage having rectangular waves or sin waves, or the like.

(Second Degree of Diffusion Defect-Determination Unit 13)

Figure 5:
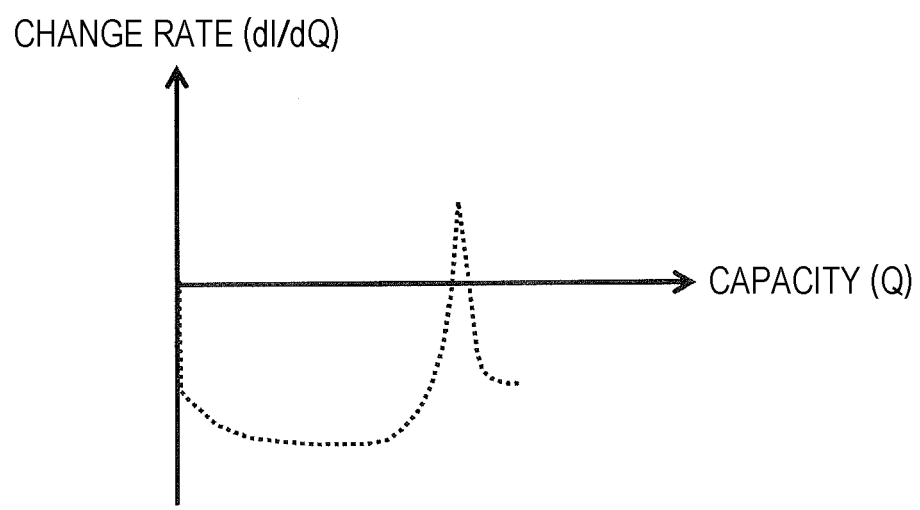
FIG. 5 is an example of a wave form in which a value obtained by dividing a change over time of a current value during constant voltage charging by a change over time of a capacity is put on the longitudinal axis and the capacity is put on the abscissa axis.

The second degree of diffusion defect-determination unit 13 determines whether or not an extreme value is present on a wave form in which a value obtained by dividing a change over time of the current value during constant voltage charging by a change over time of a capacity is put on the longitudinal axis and the capacity is put on the abscissa axis, and in a case where the extreme value is absent, the determination unit 13 determines that the degree of diffusion defect is a second degree of diffusion defect. FIG. 5 shows an example of a wave form in which a value obtained by dividing a change over time of the current value during constant voltage charging by a change over time of a capacity is put on the longitudinal axis and the capacity is put on the abscissa axis.

Furthermore, in a preferable embodiment of the present disclosure, the first degree of diffusion defect-determination unit 12 can have a constitution such that the first degree of diffusion defect is determined from a result of an analysis of voltage responses during application of a constant current and during a rest. The rest means a state of an open circuit. Furthermore, in this preferable constitution, the constitution can be such that the second degree of diffusion defect is determined as a result of an analysis of a current response during application of a constant voltage. Furthermore, in this case, the above-mentioned determination process can have a constitution that determines whether or not an extreme value is present on a wave form in which a value obtained by dividing a change over time of the current value during constant voltage charging by a change over time of a capacity is put on the longitudinal axis and the capacity is put on the abscissa axis, and in a case where the extreme value is absent, the degree of diffusion defect is determined to be a second degree of diffusion defect.

[State Evaluation Unit 2]

The state evaluation unit 2 is configured to evaluate the state of the secondary battery 4 on the basis of the result of the determination of the determination unit 1. The state of the secondary battery means a voltage response state against a capacity of the secondary battery.

[Charge-Discharge Control Unit 3]

The charge-discharge control unit 3 is configured to control the state of the application of a current and the application of a voltage to the secondary battery during the charging or discharging of the secondary battery on the basis of the result of the evaluation of the state evaluation unit 2. The control method by the charge-discharge control unit 3 has one or more control(s) besides a general control of charging and discharging. The control other than the general control herein may be one or more control(s).

The present inventors found that deterioration by reversible Li loss is suppressed, and a cycle property is improved without lowering a volume energy density by conducting another control during sensing of a degree of diffusion defect besides a general charging control. The embodiment of the control method that is different from a general charging control is not specifically questioned as long as it is an action to solve a degree of diffusion defect. For example, decreasing of a current density, providing a rest time in the midstream, and the like can be used. For example, as a typical example, a case during constant current-constant voltage charging can be exemplified. In a case where a voltage response analysis during constant current charging, the first degree of diffusion defect-determination unit 12 determines that the degree of diffusion defect is a first degree of diffusion defect, and the second degree of diffusion defect-determination unit 13 determines that the degree of diffusion defect is a second degree of diffusion defect during constant voltage charging, the charge-discharge control unit 3 conduct a control to extend to an extreme value or a control to provide a certain rest time when a value obtained by dividing a change over time of the current value during constant voltage charging by a change over time of a capacity is put on the longitudinal axis and the capacity is put on the abscissa axis. The embodiment of the control method by the charge-discharge control unit 3 is not specifically questioned as long as rapid deterioration by reversible Li loss is suppressed. The charge-discharge control unit 3 may charge the secondary battery 4 so that a diffusion defect state is solved by control of a charge-discharge current pulse, step charging of a voltage, or the like.

In the evaluation method and the production method for a secondary battery, and the charge-discharge control device according to the present disclosure explained above, which include various preferable embodiments and constitutions, the secondary battery 4 is constituted by a lithium ion secondary battery. The constitution of the secondary battery 4, and the production method therefor will be explained.

[Constitution of Secondary Battery 4]

The secondary battery 4 has, for example, so-called a laminate film type, and includes a wound electrode body inside a film-like exterior element. The wound electrode body is formed by laminating a positive electrode and a negative electrode via a separator and electrolyte layers, and then winding around the laminate. A positive electrode lead is attached to the positive electrode, and a negative electrode lead is attached to the negative electrode. The outermost periphery part of the wound electrode body is protected by a protecting tape.

Specifically, the positive electrode and the negative electrode are facing via the separator. The electrolyte layers are disposed between the positive electrode and the separator and between the negative electrode and the separator.

The positive electrode lead and negative electrode lead are derived, for example, in the same direction from the inside to outside of the exterior element. The positive electrode lead is formed by an electroconductive material such as aluminum, and the negative electrode lead is formed by an electroconductive material such as copper, nickel and stainless. These electroconductive materials have, for example, a thin-plate form and a network form.

The exterior element is, for example, a laminate film in which a melt-bonded layer, a metal layer and a surface protective layer are laminated in this order. In this laminate film, for example, the outer periphery end parts of the melt-bonded layers of the two films are melt-bonded so that the melt-bonded layers face the wound electrode body. However, the two films may also be bonded via an adhesive or the like. Examples of the melt-bonded layer are films of polyethylene and polypropylene and the like. Examples of the metal layer are an aluminum foil and the like. Examples of the surface protective layer are films of nylon and polyethylene terephthalate and the like.

Among these, the exterior element is preferably an aluminum laminate film in which a polyethylene film, an aluminum foil and a nylon film are laminated in this order. However, the exterior element may be a laminate film having other laminate structure, may be a polymer film of polypropylene or the like, or may be a metal film.

A tight-adhesion film is inserted to between the exterior element, and the positive electrode lead and the negative electrode lead so as to prevent the inversion of outer air. This tight-adhesion film is formed by a material having adhesiveness against the positive electrode lead and the negative electrode lead. Examples of this material having tight adhesiveness include polyolefin resins such as polyethylene, polypropylene, modified polyethylene and modified polypropylene.

The positive electrode has positive electrode active substance layer(s) on one or both surface(s) of a positive electrode current collector. The positive electrode current collector is formed by an electroconductive material such as aluminum, nickel and stainless and the like.

The positive electrode active substance layer contains any one kind or two or more kinds of positive electrode material(s) that can store and release lithium ions, as positive electrode active substance(s), and may contain other materials such as a positive electrode binder and a positive electrode conductant agent as necessary.

It is preferable that the positive electrode material is a lithium-containing compound. This is because a high energy density can be obtained. Examples of this lithium-containing compound include lithium transition metal composite oxides and lithium transition metal phosphate compounds, and the like. The lithium transition metal composite oxides are oxides containing Li and one or two or more transition metal element(s) as constitutional element(s), and the lithium transition metal phosphate compounds are phosphate compounds containing Li and one or two or more transition metal element(s) as constitutional element(s). Among these, the transition metal element(s) are preferably either one kind or two or more kinds of Co, Ni, Mn and Fe and the like. This is because a higher voltage can be obtained. The chemical formula thereof is represented by, for example, $Li_xM1O_2$ and $Li_yM2PO_4$. In the formulas, either of M1 and M2 is one or more kind(s) of transition metal element(s). The values of x and y differ depending on a state of charging and discharging, and for example, $0.05 \leq x \leq 1.1$, and $0.05 \leq y \leq 1.1$.

Examples of the lithium transition metal composite oxide are $LiCoO_2$, $LiNiO_2$, and a lithium nickel-based composite oxide represented by the following formula (1), and the like. Examples of the lithium transition metal phosphate compound are $LiFePO_4$ and $LiFe1-u MnuPO_4$ (u<1) and the like. This is because a high battery capacity can be obtained, and an excellent cycle property and the like can also be obtained.

$$LiNi_{1-z}M_zO_2 \qquad (1)$$

(M is either one kind or two or more kinds from Co, Mn, Fe, Al, V, Sn, Mg, Ti, Sr, Ca, Zr, Mo, Tc, Ru, Ta, W, Re, Yb, Cu, Zn, Ba, B, Cr, Si, Ga, P, Sb and Nb, and z satisfies 0.005<z<0.5.)

Other examples of the positive electrode material may be either one kind or two or more kinds of oxides, disulfides, chalcogenides and electroconductive polymers and the like. Examples of the oxides are titanium oxide, vanadium oxide and manganese dioxide and the like. Examples of the disulfides are titanium disulfide and molybdenum sulfide and the like. Examples of the chalcogenides are niobium serenide and the like. Examples of the electroconductive polymers are sulfur, polyaniline and polythiophene and the like. However, the positive electrode material may also be a material other than the above-mentioned materials.

The positive electrode binder is, for example, either one kind or two or more kinds of synthetic rubbers and polymer materials and the like. Examples of the synthetic rubbers include styrene-butadiene-based rubbers, fluorine-based rubbers and ethylene-propylene-diene and the like. Examples of the polymer materials include polyvinylidene fluoride and polyimide and the like.

Examples of the positive electrode conductant agent are either one kind or two or more kinds of carbon materials and the like. Examples of the carbon materials include graphite, carbon black, acetylene black and Ketjen black and the like. In addition, the positive electrode conductant agent may also be a metal material and an electroconductive polymer and the like, as long as it is a material having electroconductivity.

The negative electrode active substance layer contains a negative electrode active substance and a negative electrode binder, and the negative electrode active substance contains either one kind or two or more kinds of negative electrode material(s) that can store and release lithium ions. However, the negative electrode active substance layer may also contain other materials such as a negative electrode conductant agent as necessary. The details of the negative electrode conductant agent are similar to those of, for example, the above-mentioned positive electrode conductant agent.

In order to prevent unintended precipitation of the metallic lithium on the negative electrode during the charging, it is preferable that the chargeable capacity of the negative electrode material is greater than the discharging capacity of the positive electrode. That is, it is preferable that the electrochemical equivalent amount of the negative electrode material that can store and release lithium ions is greater than the electrochemical equivalent amount of the positive electrode.

The first negative electrode active substance material is a material (metal-based material) containing either one kind or two kinds of metal elements or semi-metal elements that react with Li as constitutional element(s). This is because a high energy density can be obtained. This metal-based material may be either of a single body, an alloy or a compound, may be two or more kinds thereof, or a material having phase(s) of one kind or two or more kinds of those in at least a part. This "alloy" also includes materials consisting of two or more kinds of metal elements, as well as materials containing one or more kind(s) of metal elements and one or more kind(s) of semi-metal elements. Furthermore, "alloy" may also contain non-metallic elements. Examples of the tissues thereof include solid solutions, eutectic mixtures, intermetallic compounds, or co-existing substances of two or more kinds thereof, and the like.

Examples of the above-mentioned metal elements or semi-metal elements are either one kind or two or more kinds of metal elements and semi-metal elements that can form an alloy with lithium ions, and specific examples include Mg, B, Al, Ga, In, Si, Ge, Sn, Pb, Bi, Cd, Ag, Zn, Hf, Zr, Y, Pd and Pt and the like. Among these, one or both of Si and Sn is/are preferable. This is because Si and Sn are excellent in ability to store and release lithium ions, and a high energy density can be obtained, and thus a high battery capacity can be obtained.

The material (high capacity material) containing one or both of Si and Sn as constitutional element(s) may be a single body, alloy or compound of Si or Sn, or two or more kinds of those, or a material having phase(s) of one kind or two or more kinds of those in at least a part. However, the "single body" as used herein is only a single body in a general meaning (the single body may contain impurities in minute amounts), and does not necessarily mean a purity of 100%.

The alloy of Si contains, either one kind or two or more kinds of element(s) such as Sn, Ni, Cu, Fe, Co, Mn, Zn, In, Ag, Ti, Ge, Bi, Sb and Cr and the like as constitutional elements other than Si. The compound of Si contains, for example, either one kind or two or more kinds of C and O and the like as the constitutional element(s) other than Si. Note that the compound of Si may contain, for example, either one kind or two or more kinds of the elements explained for the alloy of Si as the constitutional element(s) other than Si.

Specific examples of the alloy or compound of Si include $SiB_4$, $SiB_6$, $Mg_2Si$, $Ni_2Si$, $TiSi_2$, $MoSi_2$, $CoSi_2$, $NiSi_2$, $CaSi_2$, $CrSi_2$, $Cu_5Si$, $FeSi_2$, $MnSi_2$, $NbSi_2$, $TaSi_2$, $VSi_2$, $WSi_2$, $ZnSi_2$, $SiC$, $Si_3N_4$, $Si_2N_2O$, $SiOv$ ($0<v\leq2$) and $Li_xSiO_y$ ($0<x\leq4$, $0<y\leq4$) and the like. Note that v in SiOv is desirably $0.2<v<1.4$, more desirably $0.8<v<1.2$. Furthermore, these alloys and compounds may store lithium in advance.

The alloy of Sn include either one kind or two or more kinds of constitutional element(s) such as Si, Ni, Cu, Fe, Co, Mn, Zn, In, Ag, Ti, Ge, Bi, Sb and Cr other than Sn. The compound of Sn contains, for example, either one kind or two or more kinds of C and O and the like as constitutional elements other than Sn. Note that the compound of Sn may contain, for example, either one kind or two or more kinds from the element explained for the alloy of Sn as the constitutional element(s) other than Sn. Specific examples of the alloy or compound of Sn include SnOw ($0<w\leq2$), $SnSiO_3$, LiSnO and $Mg_2Sn$ and the like.

Specifically, examples of the material containing Sn as the constitutional element include materials containing Sn as a first constitutional element and also containing second and third constitutional elements. Examples of the second constitutional element are either one kind or two or more kinds of Co, Fe, Mg, Ti, V, Cr, Mn, Ni, Cu, Zn, Ga, Zr, Nb, Mo, Ag, In, Ce, Hf, Ta, W, Bi and Si and the like. Examples of the third constitutional element are either one kind or two or more kinds of B, C, Al and P and the like. This is because a high energy density and the like can be obtained by containing the second and third constitutional elements.

Among these, a material containing Sn, Co and C as constitutional elements (an SnCoC-containing material) is preferable. In this SnCoC-containing material, for example, the content of C is 9.9% by mass to 29.7% by mass, and the ratio of the contents of Sn and Co (Co/(Sn+Co)) is 20% by mass to 70% by mass. This is because a high energy density can be obtained.

The SnCoC-containing material has a phase containing Sn, Co and C, and the phase is preferably low-crystalline or amorphous. Since this phase is a reaction phase that can react with Li, an excellent property can be obtained due to the presence of the reaction phase. The half width of the diffraction peak obtained by the X-ray diffraction of this phase is preferably 1° or more at a diffraction angle of 2θ in a case where CuKα ray is used as specific X-ray and the sweeping velocity is set to 1°/min. This is because lithium ions are stored and released more smoothly, and reactivity with an electrolyte is decreased. Note that there is also a case where the SnCoC-containing material contains a phase containing a single body or a part of respective constitutional elements besides the low-crystalline or amorphous phase.

Whether or not a diffraction peak obtained by X-ray diffraction corresponds to a reaction phase that can react with Li can be easily judged by comparing X-ray diffraction charts before and after the electrochemical reaction with Li. For example, if the position of the diffraction peak changes before and after the electrochemical reaction with Li, then the diffraction peak corresponds to a reaction phase that can react with Li. In this case, for example, a diffraction peak of a low crystalline or amorphous reaction phase is seen in 2θ=20° to 50°. It is considered that such reaction phase has, for example, the above-mentioned respective constitutional elements, and has been low-crystallized or become amorphous due to mainly the presence of C.

In the SnCoC-containing material, it is preferable that at least a part of C as the constitutional element is bonded to a metal element or a semi-metal element, which is other constitutional element. This is because the flocculation and crystallization of Sn and the like are suppressed. The bonding state of the elements can be confirmed, for example, by using a X-ray photoelectron spectroscopy (XPS). In a commercially available apparatus, for example, Al-Kα ray and Mg-Kα ray and the like are used as soft X-ray. In a case where at least a part of C is bonded to a metal element or a semi-metal element or the like, a peak of a synthetic wave of the 1s orbit of C (C1s) appears at an area lower than 284.5 eV. In addition, it is deemed that energy calibration has been made so that the peak of the 4f orbit (Au4f) of Au atom is obtained at 84.0 eV. Since surface staining carbon is generally present on the surface of the substance at this time, the peak of the C1s of the surface staining carbon is set as 284.8 eV and used as an energy standard. In an XPS measurement, since the wave form of the peak of C1s is obtained in a form containing the peak of the surface staining carbon and the peak of the carbon in the SnCoC-containing material, the two peaks are separated by using, for example, commercially available software. In the analysis of a wave form, the position of the main peak present at the side of the lowest bound energy is set as an energy standard (284.8 eV).

Note that the SnCoC-containing material is not limited to a material containing only Sn, Co and C as constitutional elements (SnCoC). This SnCoC-containing material may further contain, for example, either one kind or two or more kinds of Si, Fe, Ni, Cr, In, Nb, Ge, Ti, Mo, Al, P, Ga and Bi and the like as constitutional elements besides Sn, Co and C.

In addition to the SnCoC-containing material, a material containing Sn, Co, Fe and C as constitutional elements (an SnCoFeC-containing material) is also preferable. The composition of this SnCoFeC-containing material is an optional composition. For example, in a case where the content of Fe is set to be relatively small, the content of C is 9.9% by mass to 29.7% by mass, the content of Fe is 0.3% by mass to 5.9% by mass, and the ratio of the contents of Sn and Co (Co/(Sn+Co)) is 30% by mass to 70% by mass. Furthermore, in a case where the content of Fe is set to be relatively large, the content of C is 11.9% by mass to 29.7% by mass, the ratio of the contents of Sn, Co and Fe ((Co+Fe)/(Sn+Co+Fe)) is 26.4% by mass to 48.5% by mass, and the ratio of the contents of Co and Fe (Co/(Co+Fe)) is 9.9% by mass to 79.5% by mass. This is because a high energy density can be obtained in such composition ranges. In addition, the physical properties (half width and the like) of the SnCoFeC-containing material are similar to those of the above-mentioned SnCoC-containing material.

The second negative electrode active substance material is a carbon material containing graphite. This is because a potential during the storage of lithium ions is low, and thus a high energy density and the like can be obtained. Furthermore, this is because the carbon material functions as a conductant agent. Examples of this carbon material are natural graphite, artificial graphite, materials obtained by coating those graphites with amorphous carbon, and the like. Note that the shapes of the carbon material are shapes of fibers, spheres, granules and flakes, and the like.

Alternatively, the negative electrode material may be, for example, either one kind or two or more kinds of easily-graphitized carbon, hardly-graphitized carbon, metal oxides and polymer compounds and the like. Examples of the metal oxides are iron oxide, ruthenium oxide and molybdenum oxide and the like. Examples of the polymer compounds are polyacetylenes, polyanilines and polypyrroles and the like. However, the negative electrode material may be any material other than the above-mentioned materials.

The separator allows the passage of lithium ions while separating the positive electrode and the negative electrode to thereby prevent short-circuit of a current due to the contacting of the two electrodes. This separator is, for example, a porous film of a synthetic resin and a ceramic and the like, and may also be a laminate film in which two or more kinds of porous film are laminated. Examples of the synthetic resin are polytetrafluoroethylene, polypropylene and polyethylene and the like.

The electrolyte contains a solvent and an electrolyte salt, and may contain other materials such as a dopant as necessary.

The solvent contains either one kind or two or more kinds of non-aqueous solvents such as organic solvents. Examples of this non-aqueous solvent are cyclic carbonate esters, chain carbonate esters, lactones, chain carboxylate esters and nitriles. This is because excellent battery capacity, cycle property and storage property and the like can be obtained. Examples of the cyclic carbonate esters include ethylene propylene carbonate and butylene carbonate and the like, and examples of the chain carbonate esters include dimethyl carbonate, diethyl carbonate, ethyl methyl carbonate and methyl propyl carbonate and the like. Examples of the lactone are γ-butyrolactone and γ-valerolactone and the like. Examples of the carboxylate esters include methyl acetate, ethyl acetate, methyl propionate, ethyl propionate, methyl butyrate, methyl isobutyrate, methyl trimethylacetate and ethyl trimethylacetate and the like. Examples of the nitriles are acetonitrile, glutalonitrile, adiponitrile, methoxyacetonitrile and 3-methoxypropionitrile and the like.

Examples of other non-aqueous solvents may be 1,2-dimethoxyethane, tetrahydrofuran, 2-methyltetrahydrofuran, tetrahydropyran, 1,3-dioxolane, 4-methyl-1,3-dioxolane, 1,3-dioxane, 1,4-dioxane, N,N-dimethylformamide, N-methylpyrrolidinone, N-methyloxazolidinone, N,N'-dimethylimidazolidinone, nitromethane, nitroethane, sulfolane, trimethyl phosphate and dimethylsulfoxide and the like. This is because similar advantages can be obtained.

Among these, either one kind or two or more kinds of ethylene carbonate, propylene carbonate, dimethyl carbonate, diethyl carbonate and ethyl methyl carbonate is/are preferable. This is because more excellent battery capacity, cycle property and storage property and the like can be obtained. In this case, a combination of a high viscosity (high dielectric constant) solvent such as ethylene carbonate and propylene carbonate and the like (for example, specific dielectric constant ε≥30) and a low viscosity solvent (for example, viscosity ≤1 mPa·s) such as dimethyl carbonate, ethyl methyl carbonate and diethyl carbonate and the like is more preferable. This is because the dissociation property of the electrolyte salt and the ion mobility are improved.

Specifically, it is preferable that the solvent contains either one kind or two or more kinds of unsaturated cyclic carbonate ester(s). This is because a stable protection film is formed mainly on the surface of a negative electrode 22 during charging and discharging, and thus the decomposition reaction of the electrolyte is suppressed. The unsaturated cyclic carbonate ester refers to a cyclic carbonate ester containing one or two or more unsaturated carbon bond(s) (carbon-carbon double bond(s)), and examples are vinylene carbonate, vinylethylene carbonate and methylene ethylene carbonate and the like. The content of the unsaturated cyclic carbonate ester in the solvent is not specifically limited, and is, for example, 0.01 wt % to 10 wt %.

Furthermore, it is preferable that the solvent contains either one kind or two or more kinds of halogenated carbonate ester(s). This is because a stable protection film is formed mainly on the surface of the negative electrode 22 during charging and discharging, and thus the decomposition reaction of the electrolyte is suppressed. The halogenated carbonate ester refers to a cyclic or chain carbonate ester containing one or two or more halogen(s) as constitutional element(s). Examples of the cyclic halogenated carbonate esters include 4-fluoro-1,3-dioxolan-2-one and 4,5-difluoro-1,3-dioxolan-2-one and the like. Examples of the chain halogenated carbonate esters include fluoromethylmethyl carbonate, bis(fluoromethyl) carbonate and difluoromethylmethyl carbonate and the like. The content of the halogenated carbonate ester in the solvent is not specifically limited, and is, for example, 0.01 wt % to 50 wt %.

Furthermore, it is preferable that the solvent contains either one kind or two or more kinds of sultone(s) (cyclic sulfonate ester(s)). This is because the chemical stability of the electrolyte is further improved. Examples of this sultone are propanesultone and propenesultone and the like. The content of the sultone in the solvent is not specifically limited, and is, for example, 0.5 wt % to 5 wt %.

Furthermore, it is preferable that the solvent contains either one kind or two or more kinds of acid anhydrides. This is because the chemical stability of the electrolyte is further improved. Examples of this acid anhydride are carboxylic anhydrides, disulfonic anhydrides and carboxylic sulfonic anhydrides and the like. Examples of the carboxylic anhydrides are succinic anhydride, glutalic anhydride and maleic anhydride and the like. Examples of the disulfonic anhydrides are ethanedisulfonic anhydride and propanedisulfonic anhydride and the like. Examples of the carboxylic sulfonic anhydrides are sulfobenzoic anhydride, sulfopropionic anhydride and sulfobutyric anhydride and the like. The content of the acid anhydride in the solvent is not specifically limited, and is, for example, 0.5 wt % to 5 wt %.

The electrolyte salt contains, for example, either one kind or two or more kinds of lithium salt(s), and may also contain salts other than lithium salts (for example, light metal salts other than lithium salts and the like) as necessary.

Examples of the lithium salts are lithium hexafluorophosphate ($LiPF_6$), lithium tetrafluoroborate ($LiBF_4$), lithium perchlorinate ($LiClO_4$), lithium hexafluoroarsenate ($LiAsF_6$), lithium tetraphenylborate ($LiB(C_6H_5)_4$), lithium methanesulfonate ($LiCH_3SO_3$), lithium trifluoromethanesulfonate ($LiCF_3SO_3$), lithium tetrachloroaluminate ($LiAlCl_4$), dilithium hexafluoridesilicate ($Li_2SiF_6$), lithium chloride (LiCl) and lithium bromide (LiBr). This is because excellent battery capacity, cycle property and storage property and the like can be obtained.

Among these, either one kind or two or more kinds of $LiPF_6$, $LiBF_4$, $LiClO_4$ and $LiAsF_6$ is/are preferable, and $LiPF_6$ is more preferable. This is because the internal resistance is lowered, and thus higher effects can be obtained.

The content of the electrolyte salt is preferably 0.3 mol/kg to 3.0 mol/kg with respect to the solvent. This is because a high ion conductivity can be obtained.

[Method for Producing Secondary Battery 4]

This secondary battery 4 is produced by, for example, the following procedures.

In the first procedure, a positive electrode is firstly prepared. In this case, a positive electrode active substance, and a positive electrode binder and a positive electrode conductant agent and the like as necessary are mixed to give a positive electrode combined preparation. Subsequently, the positive electrode combined preparation is dispersed in an organic solvent and the like to give a paste-like positive electrode combined preparation slurry. Subsequently, the positive electrode combined preparation slurry is applied onto the both surfaces of the positive electrode current collector and dried, whereby a positive electrode active substance layer is formed. Subsequently, the positive electrode active substance layer is compression-molded by using a roll press machine or the like under heating as necessary. In this case, the compression molding may be repeated plural times.

Furthermore, a negative electrode is prepared by similar procedures to that mentioned above for the positive electrode. In this case, a negative electrode combined preparation in which a negative electrode active substance and a negative electrode binder (a polymer compound for binding), and a negative electrode conductant agent and the like as necessary have been mixed is dispersed in an organic solvent and the like to give a paste-like negative electrode combined preparation slurry. Subsequently, the negative electrode combined preparation slurry is applied onto the both surfaces of the negative electrode current collector and dried to form a negative electrode active substance layer, and the negative electrode active substance layer is then compression-molded as necessary.

Subsequently, an adhesive layer is formed onto the negative electrode. In this case, a treatment solution is prepared by dispersing a polymer compound for adhesion in an organic solvent and the like, and the treatment solution is then applied onto the surface of the negative electrode active substance layer and dried.

Subsequently, a precursor solution containing an electrolyte in which an electrolyte salt is dispersed in a solvent, a polymer compound for an electrolyte, and a solvent such as an organic solvent is prepared, and the precursor solution is applied onto the positive electrode to form a gel-like electrolyte layer. Subsequently, a positive electrode lead is attached to a positive electrode current collector by using a welding process or the like, and a negative electrode lead is attached to a negative electrode current collector by using a welding process or the like. Subsequently, the positive electrode and the negative electrode are laminated via a separator, and the laminate is wound around to thereby prepare a wound electrode body, and a protecting tape is then attached to the outermost periphery part of the wound electrode body. Subsequently, the wound electrode body is interposed to between two film-like exterior elements, and the outer periphery end parts of the exterior elements are bonded by using a heat melt process or the like to enclose the wound electrode body inside the exterior elements. In this case, a tight-adhesion film is inserted to between the positive electrode lead and the negative electrode lead, and the exterior element.

In the second procedure, a positive electrode and a negative electrode are formed, a positive electrode lead is attached to the positive electrode, and a negative electrode lead is attached to the negative electrode according to a similar procedure to that of the first procedure. Subsequently, the positive electrode and the negative electrode are laminated via a separator, and the laminate is wound around to prepare a wound body, which is a precursor of a wound electrode body, and a protecting tape is attached to the outermost periphery part of the wound electrode body. Subsequently, the wound body is interposed to between two film-like exterior elements, and the outer periphery end parts except for one outer periphery end part are bonded by using a heat melt process and the like, whereby the wound body is housed inside a sac-like exterior element. Subsequently, a composition for an electrolyte containing an electrolyte, a monomer as a raw material for a polymer compound for an electrolyte, a polymerization initiator, and other materials such as a polymerization inhibitor as necessary is prepared and injected in the sac-like exterior element, and the exterior element is enclosed by using a heat melt process and the like. Subsequently, the monomer is subjected to thermal polymerization to give a polymer compound for an electrolyte. By this way, a gel-like electrolyte layer is formed.

In the third procedure, a wound body is prepared in a similar manner to that in the above-mentioned second procedure except for that a separator in which a polymer compound has been applied onto the both surfaces is used, and housed inside the sac-like exterior element. The polymer compound applied onto this separator is, for example, a polymer containing vinylidene fluoride as a component (a homopolymer, a copolymer or a multi-component copolymer) or the like. Specific examples are two-component copolymers containing polyvinylidene fluoride, vinylidene fluoride and hexafluoropropylene as components, three-component copolymers containing vinylidene fluoride, hexafluoropropylene and chlorotrifluoroethylene as components, and the like. In addition, other one kind or two or more kinds of polymer compound(s) may also be used together with the polymer containing vinylidene fluoride as a component. Subsequently, an electrolyte is prepared and injected inside the exterior element, and the opening of the exterior element is tightly sealed by using a heat melt process or the like. Subsequently, the exterior element is heated while applying a weight to attain tight-adhesion of the separator to the positive electrode and the negative electrode via the polymer compound. Since the polymer compound is impregnated with the electrolyte by this way, the polymer compound is gelled and thus an electrolyte layer is formed.

In this third procedure, the swelling of the secondary battery 4 is suppressed more than in the first procedure. Furthermore, since the monomer as the raw material of the polymer compound, and the solvent and the like are left with little in the electrolyte layer in the third procedure as compared to the second procedure, the processes of forming the polymer compound are finely controlled. Therefore, sufficient tight adhesion of the positive electrode, the negative electrode and the separator to the electrolyte layer is attained.

[Method for Evaluating Secondary Battery 4]

Figure 6:
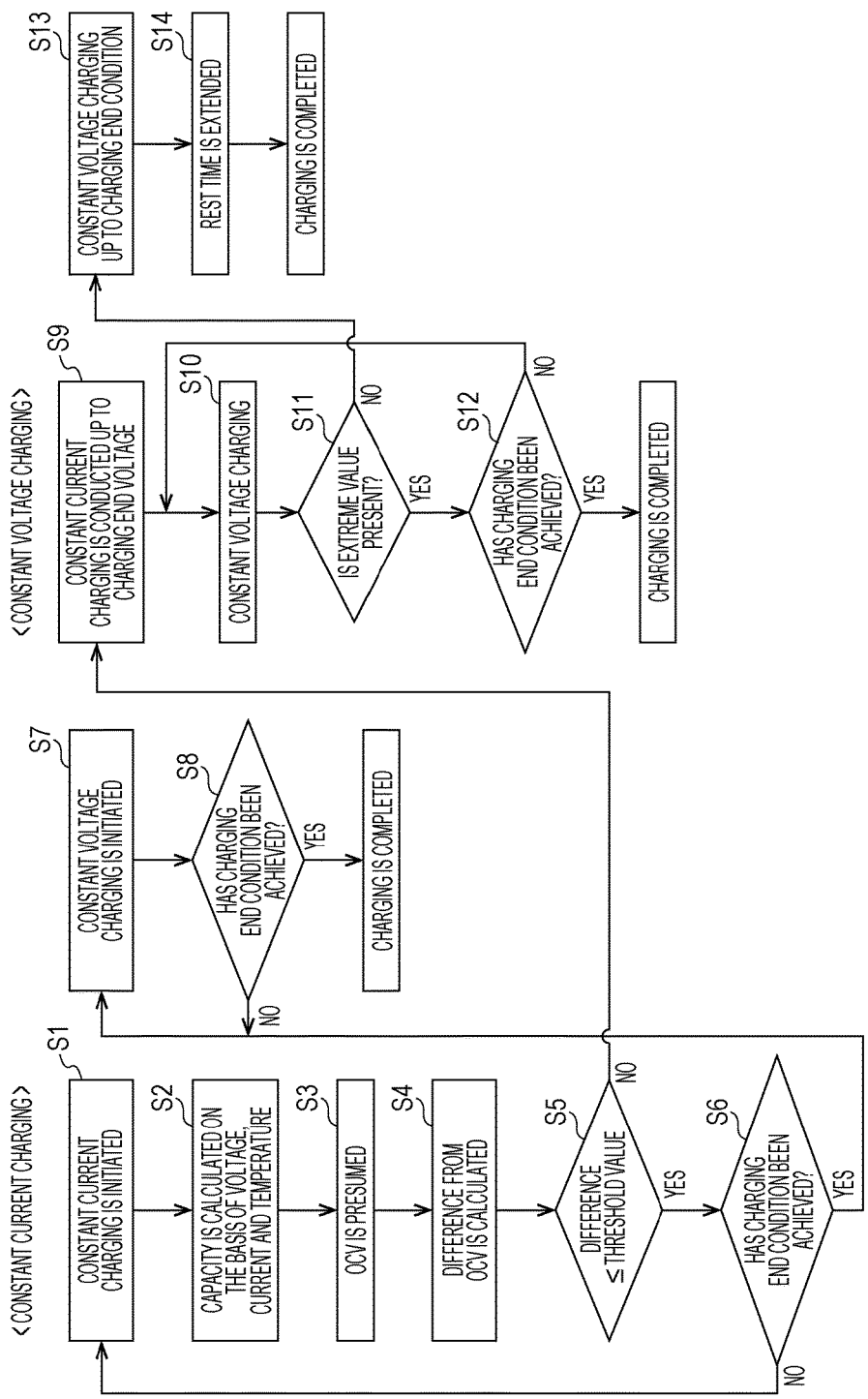
FIG. 6 is a flow chart showing examples of an evaluation method and a production method for a secondary battery 4 in the present disclosure.

FIG. 6 is a flow chart showing examples of an evaluation method and a production method for the secondary battery 4 in the present disclosure. In this evaluation method, constant voltage charging (CV) is conducted subsequent to constant current charging (CC).

Firstly, a charge-discharge control unit 3 initiates constant current charging (S1). Furthermore, a determination unit 1 calculates a capacity (Q) of the secondary battery 4 on the basis of a voltage, a current and a temperature of the secondary battery 4 (S2). Subsequently, an OCV presumption unit 11 presumes an OCV on the basis of a position of an inflection point on a wave form in which a change rate (dV/dQ) of a voltage (V) with respect to a capacity (Q) is put on the longitudinal axis and the capacity (Q) is put on the abscissa axis (S3).

In S4, a first degree of diffusion defect-determination unit 12 calculates a difference from the OCV for a voltage response during constant current charging (S4). Furthermore, in S5, the first degree of diffusion defect-determination unit 12 determines whether or not the calculated difference is greater than a predetermined threshold value. In a case where the difference is equal to or less than the threshold value (YES in S5), then the determination unit 1 determines whether or not a charging ending condition is achieved (S6). In a case where the charging ending condition is achieved (YES in S6), then the processing transfers to S7. On the other hand, in a case where the charging ending condition is not achieved yet (NO in S6), then the processing repeats S1.

In S7, the charge-discharge control unit 3 initiates constant voltage charging. Furthermore, in S8, the determination unit 1 determines whether or not a charging ending condition is achieved. In a case where the charging ending condition is achieved (YES in S8), then the charging of the secondary battery 4 is completed. On the other hand, in a case where the charging ending condition is not achieved yet (NO in S8), then the processing repeats S7.

On the other hand, in a case where the difference is greater than a threshold value in S5 (NO in S5), the first degree of diffusion defect-determination unit 12 determines that the degree of diffusion defect is a first degree of diffusion defect, and the processing transfers to S9.

In S9, the charge-discharge control unit 3 conducts constant current charging up to a charging ending voltage. After this charging, in S10, the charge-discharge control unit 3 initiates constant voltage charging. Furthermore, in S11, the second degree of diffusion defect-determination unit 13 determines whether or not an extreme value is present on a wave form in which a value obtained by dividing a change over time of the current value by a change over time of a capacity is put on the longitudinal axis and the capacity is put on the abscissa axis. In a case where an extreme value is present (YES in S11), then the determination unit 1 determines whether or not a charging ending condition is achieved (S12). In a case where a charging ending condition is achieved (YES in S12), then the charging of the secondary battery 4 is completed. On the other hand, in a case where a charging ending condition is not achieved yet (NO in S12), then the processing repeats S10.

On the other hand, in a case where an extreme value is absent in S11, the second degree of diffusion defect-determination unit 13 determines that the degree of diffusion defect is a second degree of diffusion defect, and the processing transfers to S13. In S13, the charge-discharge control unit 3 conducts constant voltage charging up to a charging ending condition. After this charging, in S14, the charge-discharge control unit 3 conducts a control to extend a rest time by a predetermined time. Furthermore, the charging of the secondary battery 4 is completed.

In this exemplary embodiment, in addition to a general charging control by the charge-discharge control unit 3, the charge-discharge control unit 3 conducts other control when the first degree of diffusion defect-determination unit 12 senses the first degree of diffusion defect, and the second degree of diffusion defect-determination unit 13 senses the second degree of diffusion defect. Therefore, deterioration by reversible Li loss is suppressed, and thus a cycle property can be improved without lowering a volume energy density.

Second Exemplary Embodiment

Figure 7:
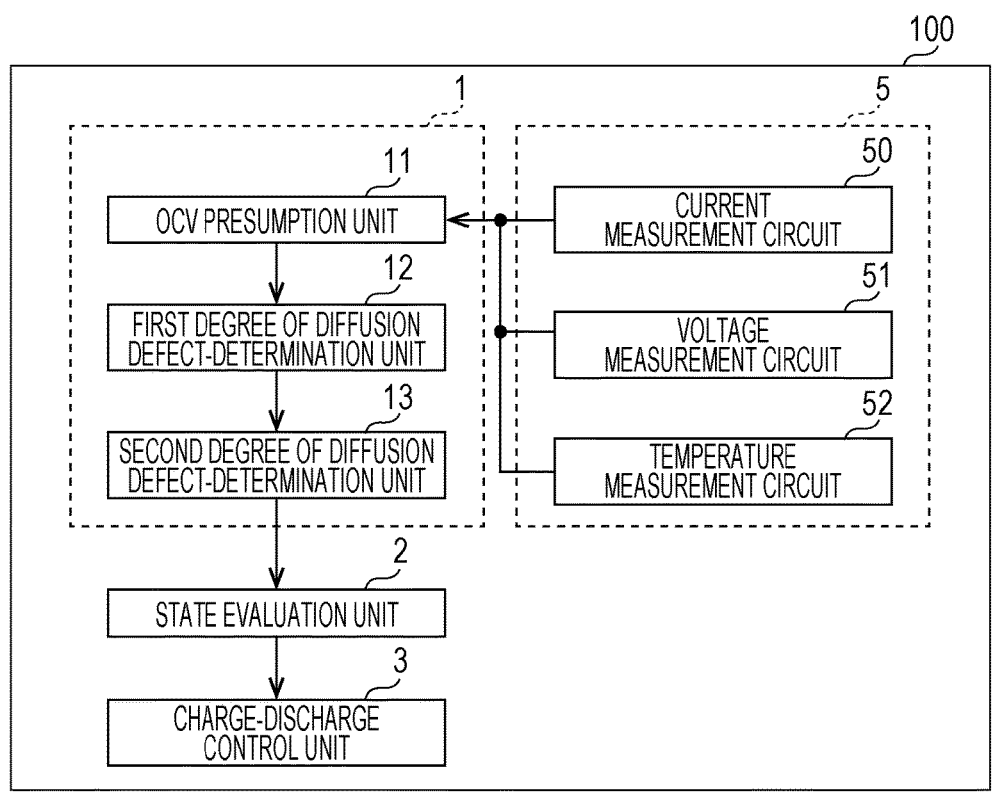
FIG. 7 is a schematic conception drawing schematically showing a second exemplary embodiment of a secondary battery 100 according to the present disclosure.

Secondly, the secondary battery according to a second exemplary embodiment of the present disclosure will be explained. FIG. 7 is a schematic conceptional drawing that schematically shows the second exemplary embodiment of a secondary battery 100 according to the present disclosure. The same symbols are attached to the same factors as the factors explained in the first exemplary embodiment, and the detailed explanations thereof are omitted. In this exemplary embodiment, the secondary battery 100 generally includes a determination unit 1, a state evaluation unit 2 and a charge-discharge control unit 3, and this exemplary embodiment is different from the first exemplary embodiment in that the secondary battery 100 can further include a detection unit 5 and the like as necessary. The other constitutions are the same as those in FIG. 1 of the first exemplary embodiment. Therefore, the explanations are omitted.

In this exemplary embodiment, a similar effect to that in the first exemplary embodiment can be obtained. Furthermore, since the secondary battery 100 include the determination unit 1, the state evaluation unit 2 and the charge-discharge control unit 3 in this exemplary embodiment, the quality of the secondary battery 100 can be maintained even in the state where a user is using the secondary battery 100 after the shipping of the secondary battery 100, by suppressing deterioration due to reversible Li loss by controlling charging and discharging by the charge-discharge control unit 3 when the first degree of diffusion defect-determination unit 12 senses the first degree of diffusion defect, and when the second degree of diffusion defect-determination unit 13 senses the second degree of diffusion defect.

Furthermore, the present disclosure can also have the following constitutions.

(1)

A method for evaluating a secondary battery, including conducting at least:

a determination step of determining a degree of diffusion defect of an ion that performs electric conduction;

an evaluation step of evaluating a state of the secondary battery on the basis of the result of the determination in the determination step; and a control step of controlling states of current application and voltage application on the secondary battery during charging or during discharging of the secondary battery on the basis of the result of the evaluation in the evaluation step.

(2)

A method for producing a secondary battery, including at least:

a determination process of determining a degree of diffusion defect of an ion that performs electric conduction;

an evaluation process of evaluating a state of the secondary battery on the basis of the result of the determination in the determination process; and a control process of controlling, on the basis of the result of the evaluation in the evaluation process, states of current application and voltage application on the secondary battery during charging or during discharging of the secondary battery.

(3)

The method for producing a secondary battery according to (2), in which a first degree of diffusion defect is determined by a result of an analysis of voltage responses during application of a constant current and during a rest.

(4)

The method for producing a secondary battery according to (3), in which a second degree of diffusion defect is determined by a result of an analysis of a current response during application of a constant voltage.

(5)

The method for producing a secondary battery according to (3), further including a calculation process, in which a difference from an open circuit voltage (OCV) during constant current charging, in which in the determination process, whether or not the difference calculated in the calculation process exceeds a predetermined threshold value is determined, and in a case where the difference is greater than the threshold value, the degree of diffusion defect is determined to be the first degree of diffusion defect.

(6)

The method for producing a secondary battery according to (4), in which the determination process determines whether or not an extreme value is present on a wave form in which a value obtained by dividing a change over time of the current value during constant voltage charging by a change over time of a capacity is put on the longitudinal axis and the capacity is put on the abscissa axis, and in a case where the extreme value is absent, the degree of diffusion defect is determined to be the second degree of diffusion defect.

(7)

The method for producing a secondary battery according to (5), in which the open circuit voltage (OCV) is presumed on the basis of a position of an inflection point on a wave form in which a change rate (dV/dQ) of a voltage (V) against a capacity (Q) is put on the longitudinal axis and the capacity (Q) is put on the abscissa axis.

(8)

The method for producing a secondary battery according to (5), in which the open circuit voltage (OCV) is presumed by using standard data of an SOC-OCV curve showing the relationship with a state of charge (SOC).

(9)

A charge-discharge control device, including:

a determination unit configured to determine a degree of diffusion defect of an ion that performs electric conduction;

a state evaluation unit configured to evaluate a state of a secondary battery on the basis of the determination result from the determination unit; and a charge-discharge control unit configured to control the states of application of a current and application of a voltage to the secondary battery during charging or during discharging of the secondary battery on the basis of the evaluation result of the state evaluation unit.

(10)

A secondary battery, including:

a determination unit configured to determine a degree of diffusion defect of an ion that performs electric conduction;

a state evaluation unit configured to evaluate a state of the secondary battery on the basis of the determination result from the determination unit; and a charge-discharge control unit configured to control the states of application of a current and application of a voltage to the secondary battery during charging or during discharging of the secondary battery on the basis of the evaluation result of the state evaluation unit.

Note that the effect described in the present specification is merely exemplification and is not limited, and any other effects may also be present.

Examples

The effect of the present disclosure will be explained below in detail by Example of the present disclosure. This Example relates to an evaluation method and a production method for the secondary battery of the first exemplary embodiment of the present disclosure, and a charge-discharge control device.

In this Example, a charge-discharge controlling test was conducted by using a lithium ion secondary battery as a sample. The materials and specification of the lithium ion secondary battery are as follows. Furthermore, in this specification, a database of threshold values for use in the determination of a first degree of diffusion defect by a first degree of diffusion defect-determination unit 12 is shown in the following Table 2.

<Major Materials>
Positive electrode: lithium cobaltate
Negative electrode: graphite
<Specification>
A battery having a rate of an Li storage amount of a negative electrode when the battery has been fully charged with respect to a Li storable amount of the negative electrode of 90%

TABLE 2

| SOC | mV |
|---|---|
| 20 | 6.5 |
| 25 | 6.8 |
| 30 | 8.6 |
| 35 | 11.6 |
| 40 | 15.6 |
| 45 | 20.7 |
| 50 | 26.5 |
| 55 | 32.6 |
| 60 | 37.1 |

As mentioned above, the lithium ion secondary battery was a polymer cell having lithium cobaltate as a positive electrode and having graphite as a negative electrode. In this Example, a negative electrode having a composition of 94.5 parts by weight of Gr, 3.5 parts by weight of polyvinylidene fluoride and 2 parts by weight of a conduction supporting agent was used as the negative electrode. Furthermore, a positive electrode having a composition of 98 parts by weight of lithium cobaltate, 1.2 parts by weight of polyvinylidene fluoride and 0.8 parts by weight of a conduction supporting agent was used as the positive electrode.

In the charge-discharge controlling test in this Example, as a first charge-discharge control, general charge-discharge control (charge-discharge control without any processes for determining a first degree of diffusion defect and for determining a second degree of diffusion defect) was conducted. The conditions for the general charge-discharge control are as follows.

Charging: 1 C, CCCV, 4.35 V/0.05 C cut
Discharging: 1 C, 3 V cut
Rest: each 10 minutes Furthermore, in the charge-discharge controlling test in this Example, in accordance with the flow chart shown in FIG. 6, a rest time was extended as a second charge-discharge control for determining the first degree of diffusion defect and the second degree of diffusion defect. In this Example, in the case where a difference between an OCV presumed in an OCV presumption unit 11 and a voltage during constant current charging increased by 40 mV or more from the threshold value stored in the database within SOC of 40-60%, the first degree of diffusion defect-determination unit 12 determined that the degree of diffusion defect was the first degree of diffusion defect. Furthermore, in this Example, when the first degree of diffusion defect was determined, the second degree of diffusion defect-determination unit 13 observed the change in a current during constant voltage charging, and a case where an inflection point of a differential value of a current value is absent, the degree of diffusion defect was determined to be the second degree of diffusion defect. Furthermore, the charge-discharge control unit 3 conducted a control for extending a rest time by 20 minutes, from 10 minutes to 30 minutes.

Furthermore, in this Example, a charge-discharge efficiency (%) was calculated from a ratio of a charging capacity and a discharging capacity in the charge-discharge test in which the first charge-discharge control and the second charge-discharge control were conducted. The result of the calculation is shown in the following Table 3. Note that Comparative Example 1 in Table 3 shows a case where only a first charge-discharge control (a general charge-discharge control) was conducted without conducting a second charge-discharge control.

TABLE 3

| | Charge-discharge efficiency (%) |
|---|---|
| Example | 99.98 |
| Comparative Example | 99.88 |

Furthermore, the conditions for this Example and Comparative Example are as shown in the following Table 4.

TABLE 4

| | Determination of diffusion defect | Current during constant current charging | Cut voltage during constant current charging | End current during constant voltage charging | Charge rest time | Discharge current | Discharge end voltage |
|---|---|---|---|---|---|---|---|
| Example | Present | 1 C | 4.35 V | 0.05 C | 30 minutes Determination of diffusion defect | 1 C | 3 V |
| Comparative Example | Absent | 1 C | 4.35 V | 0.05 C | 10 minutes | 1 C | 3 V |

It was confirmed from the result shown in Table 3 that a charge-discharge efficiency is improved by incorporating controls to avoid a first degree of diffusion defect and a second degree of diffusion defect as in Example.

REFERENCE SIGNS LIST

1 Determination unit
2 State evaluation unit
3 Charge-discharge control unit 4, 100 Secondary battery
5 Detection unit
10 Charge-discharge control device
11 OCV presumption unit
12 First degree of diffusion defect-determination unit
13 Second degree of diffusion defect-determination unit
50 Current measurement circuit
51 Voltage measurement circuit
52 Temperature measurement circuit

The invention claimed is:

1. A method for evaluating a secondary battery, comprising conducting at least:
   a determination step of determining a degree of diffusion defect of an ion that performs electric conduction;
   an evaluation step of evaluating a state of the secondary battery on the basis of a result of the determination in the determination step;
   a control step of controlling states of current application and voltage application on the secondary battery during charging or during discharging of the secondary battery, on the basis of a result of the evaluation in the evaluation step, and
   a calculation step, in which a difference from an open circuit voltage (OCV) during constant current charging is calculated,
   wherein a first degree of diffusion defect is determined by a result of an analysis of voltage responses during application of a constant current and during a rest,
   wherein a second degree of diffusion defect is determined by a result of an analysis of a current response during application of a constant voltage,
   wherein in the determination step, whether or not the difference calculated in the calculation step exceeds a threshold value is determined, and in a case where the difference is greater than the threshold value, the degree of diffusion defect is determined to be the first degree of diffusion defect, and
   wherein the determination step determines whether or not an extreme value is present on a wave form in which a value obtained by dividing a change over time of a current value during constant voltage charging by a change over time of a capacity is put on a longitudinal axis and the capacity is put on an abscissa axis, and in a case where the extreme value is absent, the degree of diffusion defect is determined to be the second degree of diffusion defect.

2. A method for producing a secondary battery, comprising at least:
   a determination process of determining a degree of diffusion defect of an ion that performs electric conduction;
   an evaluation process of evaluating a state of the secondary battery on the basis of a result of the determination in the determination process;
   a control process of controlling, on the basis of a result of the evaluation in the evaluation process, states of current application and voltage application on the secondary battery during charging or during discharging of the secondary battery, and
   a calculation process, in which a difference from an open circuit voltage (OCV) during constant current charging is calculated,
   wherein a first degree of diffusion defect is determined by a result of an analysis of voltage responses during application of a constant current and during a rest,
   wherein a second degree of diffusion defect is determined by a result of an analysis of a current response during application of a constant voltage,
   wherein in the determination process, whether or not the difference calculated in the calculation process exceeds a threshold value is determined, and in a case where the difference is greater than the threshold value, the degree of diffusion defect is determined to be the first degree of diffusion defect, and
   wherein the determination process determines whether or not an extreme value is present on a wave form in which a value obtained by dividing a change over time of a current value during constant voltage charging by a change over time of a capacity (Q) is put on a longitudinal axis and the capacity is put on an abscissa axis, and in a case where the extreme value is absent, the degree of diffusion defect is determined to be the second degree of diffusion defect.

3. The method for producing a secondary battery according to claim 2, wherein the open circuit voltage (OCV) is presumed on the basis of a position of an inflection point on a wave form in which a change rate (dV/dQ) of a voltage (V) against the capacity (Q) is put on the longitudinal axis and the capacity (Q) is put on the abscissa axis.

4. The method for producing a secondary battery according to claim 2, wherein the open circuit voltage (OCV) is presumed by using standard data of a state of charge (SOC)-OCV curve showing a relationship with a state of charge (SOC).

5. A charge-discharge control device, comprising:
   a determination unit configured to:
      determine a degree of diffusion defect of an ion that performs electric conduction, and
      calculate a difference from an open circuit voltage (OCV) during constant current charging;
   a state evaluation unit configured to evaluate a state of a secondary battery on the basis of a result of the determination of the determination unit; and
   a charge-discharge control unit configured to control states of application of a current and application of a voltage to the secondary battery during charging or during discharging of the secondary battery on the basis of a result of the evaluation of the state evaluation unit,
   wherein a first degree of diffusion defect is determined by a result of an analysis of voltage responses during application of a constant current and during a rest,
   wherein a second degree of diffusion defect is determined by a result of an analysis of a current response during application of a constant voltage,
   wherein, whether or not the calculated difference exceeds a threshold value is determined, and in a case where the difference is greater than the threshold value, the degree of diffusion defect is determined to be the first degree of diffusion defect, and
   wherein, whether or not an extreme value is present on a wave form in which a value obtained by dividing a change over time of a current value during constant voltage charging by a change over time of a capacity is put on a longitudinal axis and the capacity is put on an abscissa axis, and in a case where the extreme value is absent, the degree of diffusion defect is determined to be the second degree of diffusion defect.

6. A secondary battery, comprising:
   a determination unit configured to:
      determine a degree of diffusion defect of an ion that performs electric conduction, and calculate a difference from an open circuit voltage (OCV) during constant current charging;

a state evaluation unit configured to evaluate a state of the secondary battery on the basis of a result of the determination of the determination unit; and a charge-discharge control unit configured to control states of application of a current and application of a voltage to the secondary battery during charging or during discharging of the secondary battery on the basis of a result of the evaluation of the state evaluation unit, wherein a first degree of diffusion defect is determined by a result of an analysis of voltage responses during application of a constant current and during a rest, wherein a second degree of diffusion defect is determined by a result of an analysis of a current response during application of a constant voltage, wherein, whether or not the calculated difference exceeds a threshold value is determined, and in a case where the difference is greater than the threshold value, the degree of diffusion defect is determined to be the first degree of diffusion defect, and wherein, whether or not an extreme value is present on a wave form in which a value obtained by dividing a change over time of a current value during constant voltage charging by a change over time of a capacity is put on a longitudinal axis and the capacity is put on an abscissa axis, and in a case where the extreme value is absent, the degree of diffusion defect is determined to be the second degree of diffusion defect.

7. A secondary battery, comprising:

a determination unit configured to:
   determine a degree of diffusion defect of an ion that performs electric conduction, and
   calculate a difference from an open circuit voltage (OCV) during constant current charging;

a state evaluation unit configured to evaluate a state of the secondary battery on the basis of a result of the determination of the determination unit; and a charge-discharge control unit configured to control states of application of a current and application of a voltage to the secondary battery during charging or during discharging of the secondary battery on the basis of a result of the evaluation of the state evaluation unit, wherein a first degree of diffusion defect is determined by a result of an analysis of voltage responses during application of a constant current and during a rest, wherein a second degree of diffusion defect is determined by a result of an analysis of a current response during application of a constant voltage, wherein, whether or not the calculated difference exceeds a threshold value is determined, and in a case where the difference is greater than the threshold value, the degree of diffusion defect is determined to be the first degree of diffusion defect, and wherein the open circuit voltage (OCV) is presumed on the basis of a position of an inflection point on a wave form in which a change rate (dV/dQ) of a voltage (V) against a capacity (Q) is put on a longitudinal axis and the capacity (Q) is put on an abscissa axis.

8. A secondary battery, comprising:

a determination unit configured to:
   determine a degree of diffusion defect of an ion that performs electric conduction, and
   calculate a difference from an open circuit voltage (OCV) during constant current charging;

a state evaluation unit configured to evaluate a state of the secondary battery on the basis of a result of the determination of the determination unit; and a charge-discharge control unit configured to control states of application of a current and application of a voltage to the secondary battery during charging or during discharging of the secondary battery on the basis of a result of the evaluation of the state evaluation unit, wherein a first degree of diffusion defect is determined by a result of an analysis of voltage responses during application of a constant current and during a rest, wherein a second degree of diffusion defect is determined by a result of an analysis of a current response during application of a constant voltage, wherein, whether or not the calculated difference exceeds a threshold value is determined, and in a case where the difference is greater than the threshold value, the degree of diffusion defect is determined to be the first degree of diffusion defect, and wherein the open circuit voltage (OCV) is presumed by using standard data of a state of charge (SOC)-OCV curve showing a relationship with a state of charge (SOC).

* * * * *